(12) United States Patent
Kim et al.

(10) Patent No.: US 12,014,905 B2
(45) Date of Patent: Jun. 18, 2024

(54) APPARATUS AND METHOD FABRICATING SEMICONDUCTOR DEVICE

(71) Applicant: SAMSUNG ELECTRONICS CO., LTD., Suwon-si (KR)

(72) Inventors: Nam Kyun Kim, Seoul (KR); Tae-Sun Shin, Hwaseong-si (KR); Deokjin Kwon, Suwon-si (KR); Donghyeon Na, Hwaseong-si (KR); Seungbo Shim, Seoul (KR); Sungyong Lim, Seoul (KR); Minjoon Kim, Gwangmyeong-si (KR); Jin Young Bang, Hwaseong-si (KR); Bongju Lee, Hwaseong-si (KR); Jinseok Lee, Seoul (KR); Sungil Cho, Seoul (KR); Chungho Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 404 days.

(21) Appl. No.: 17/380,806

(22) Filed: Jul. 20, 2021

(65) Prior Publication Data

US 2022/0165552 A1    May 26, 2022

(30) Foreign Application Priority Data

Nov. 24, 2020  (KR) .......................... 10-2020-0158799

(51) Int. Cl.
*H01J 37/32* (2006.01)
*H01L 21/26* (2006.01)
*H01L 21/683* (2006.01)

(52) U.S. Cl.
CPC .. *H01J 37/32669* (2013.01); *H01J 37/32146* (2013.01); *H01J 37/3244* (2013.01); *H01J 37/3266* (2013.01); *H01J 37/32715* (2013.01); *H01L 21/26* (2013.01); *H01L 21/6831* (2013.01); *H01J 2237/327* (2013.01)

(58) Field of Classification Search
None
See application file for complete search history.

(56) References Cited

U.S. PATENT DOCUMENTS

| | | | |
|---|---|---|---|
| 6,254,745 B1 | 7/2001 | Vukovic | |
| 6,523,493 B1 | 2/2003 | Brcka | |
| 6,700,090 B2 | 3/2004 | Ono et al. | |
| 7,955,986 B2 | 6/2011 | Hoffman et al. | |
| 9,062,372 B2 | 6/2015 | Gopalraja et al. | |
| 9,293,353 B2 * | 3/2016 | Long | H01L 21/67069 |
| 9,805,919 B1 * | 10/2017 | Hanks | H01J 37/32165 |
| 10,573,493 B2 | 2/2020 | Todorow et al. | |
| 2001/0051438 A1 * | 12/2001 | Shin | H01L 21/31116 |
| | | | 257/E21.252 |
| 2004/0083971 A1 * | 5/2004 | Holland | H01J 37/321 |
| | | | 118/721 |
| 2014/0318710 A1 | 10/2014 | Chae et al. | |

* cited by examiner

*Primary Examiner* — Jason Berman
(74) *Attorney, Agent, or Firm* — Fish & Richardson P.C.

(57) ABSTRACT

A method of fabricating a semiconductor device include; seating a substrate having a substrate radius on an electrostatic chuck, applying first radio-frequency power to the electrostatic chuck to induce plasma in a region at least above the electrostatic chuck, and generating a magnetic field in the region at least above the electrostatic chuck using a magnet having a ring-shape and disposed above the electrostatic chuck by applying second radio-frequency power to the magnet, wherein the magnet has an inner radius ranging from about one-half to about one-fourth of the substrate radius.

16 Claims, 8 Drawing Sheets

APPARATUS AND METHOD FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2020-0158799, filed on Nov. 24, 2020 in the Korean Intellectual Property Office, the subject matter of which is hereby incorporated by reference.

BACKGROUND

The inventive concept relates generally to apparatuses and methods used in the fabrication of semiconductor devices. More particularly, embodiments of the inventive concept relate to apparatuses capable of performing fabrication processes involving the generation and/or use of plasma (hereafter generically referred to as "plasma process(es)"). Embodiments of the inventive concept also relate to methods of fabricating a semiconductor device using this type of apparatus. In this context, plasma may be generated in a defined atmosphere of gas(es) using a radio-frequency (RF) field.

Semiconductor devices are manufactured according to a sequence of processes, such as thin-film deposition processes, lithography processes, etching processes, etc. Certain thin-film deposition processes and/or etching processes may be performed in an environment including plasma. For example, plasma may be used to variously treat a semiconductor substrate at a given temperature or range of temperatures.

SUMMARY

Embodiments of the inventive concept provide apparatuses capable of generating highly uniform plasma density, as well as methods of fabricating a semiconductor device using same.

According to an embodiment of the inventive concept, a method of fabricating a semiconductor device may include; seating a substrate having a substrate radius on an electrostatic chuck, applying first radio-frequency power to the electrostatic chuck to induce plasma in a region at least above the electrostatic chuck, and generating a magnetic field in the region at least above the electrostatic chuck using a magnet having a ring-shape and disposed above the electrostatic chuck by applying second radio-frequency power to the magnet, wherein the magnet has an inner radius ranging from about one-half to about one-fourth of the substrate radius.

According to an embodiment of the inventive concept, a method of fabricating a semiconductor device may include; seating a substrate having a substrate radius on an electrostatic chuck having a chuck radius, applying first radio-frequency power to the electrostatic chuck to induce plasma in a region at least above the electrostatic chuck, and generating a magnetic field in the region at least above the electrostatic chuck using a magnet disposed above the electrostatic chuck, wherein the substrate includes a center portion having a first radial width, an intermediate portion having a second radial width, and an edge portion having a third radial width, the intermediate portion is disposed between the center portion and the edge portion and the magnet has an inner radius equal to the second radial width.

According to an embodiment of the inventive concept, an apparatus fabricating a semiconductor device may include; a chamber, an electrostatic chuck having a chuck radius and disposed in a lower portion of the chamber, wherein the electrostatic chick is configured to seat a substrate, a shower head disposed in an upper portion of the chamber above the electrostatic chuck and configured to provide gas into a region at least above the electrostatic chuck, and a magnet disposed on the shower head and configured to induce a magnetic field in the region at least above the electrostatic chuck, wherein the magnet has a ring shape including an inner radius ranging from between about one-half to one-fourth of the chuck radius.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom;

higher/lower; closer/farther; thicker/thinner; proximate/distant; above/below; under/over; upper/lower; center/side; surrounding; overlay/underlay; etc.

Figure 1:
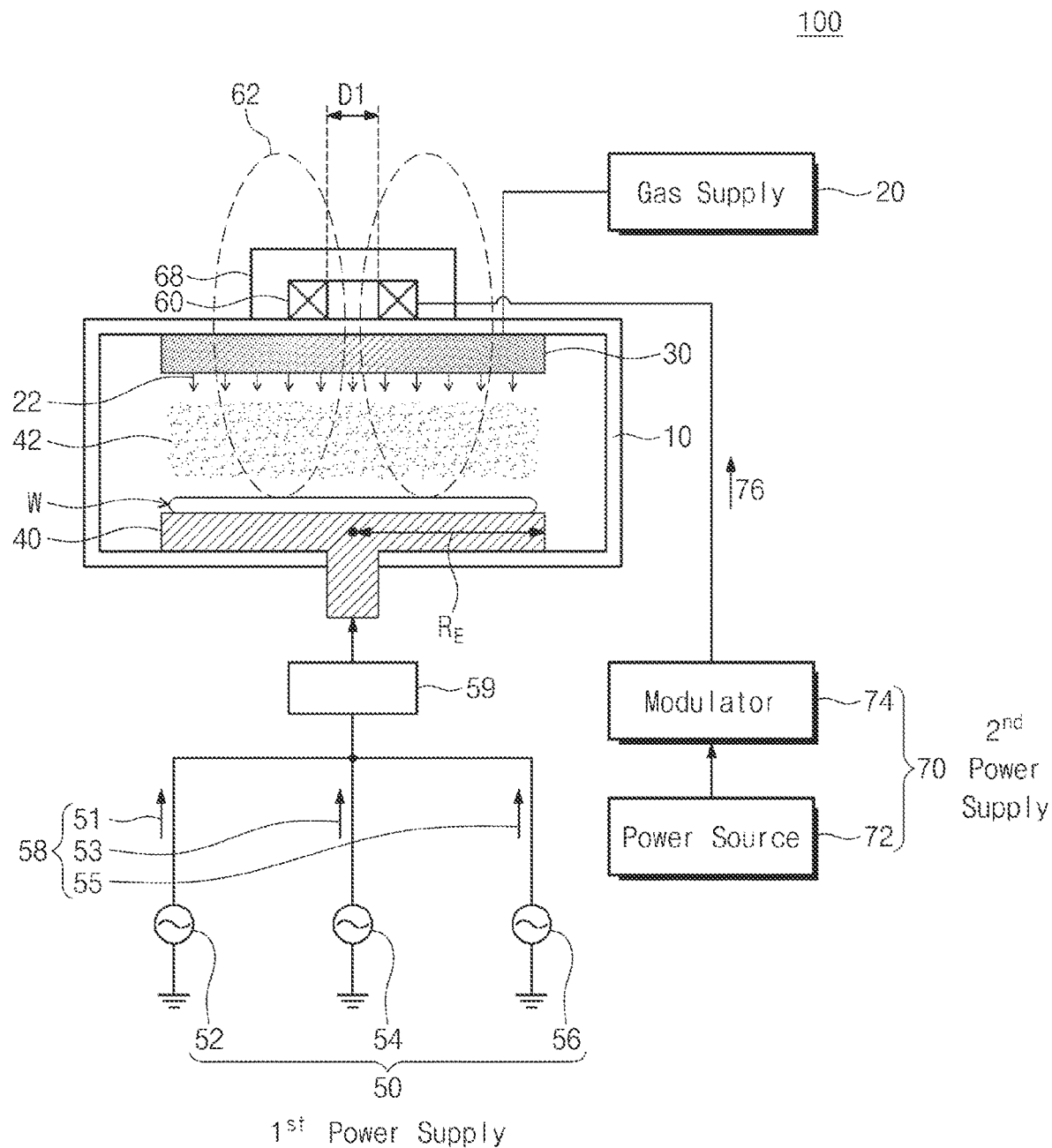
FIG. 1 is a block diagram illustrating an apparatus fabricating a semiconductor device according to embodiments of the inventive concept.

FIG. 1 is a block diagram illustrating an apparatus 100 for fabricating a semiconductor device according to embodiments of the inventive concept.

Referring to FIG. 1, the apparatus 100 is assumed to be a capacitively-coupled plasma etching apparatus, however the apparatus 100 might alternately be an inductively-coupled plasma etching apparatus. In the illustrated example of FIG. 1, the apparatus 100 may include a chamber 10, a gas supply 20, a shower head 30, an electrostatic chuck 40, a first radio-frequency (RF) power supply 50, a magnet 60, and a second RF power supply 70.

The chamber 10 provides a space in which various semiconductor fabrication processes (e.g., a plasma etching process) may be performed. That is, the chamber 10 may provide an internal space of specified volume that is isolated from the surrounding (external) environment. The configuration and shape of the chamber 10 may vary by design according to numerous factors including. for example, the nature of process(es) to-be-performed on a substrate W, as well as the size and shape (e.g., a flat, circular plate) of the substrate W. In some embodiments, the chamber 10 may have a shape sufficient to encompass the substrate W which may be seated in a relatively central position, but the inventive concept is not limited thereto.

The gas supply 20 may be disposed outside the chamber 10 and connected in such a manner as to allow the provision of one or more process gas(es) 22 into the chamber 10. Here, the process gas(es) 22 may include at least one of $CF_4$, $C_4F_6$, $C_4F_8$, COS, $CHF_3$, HBr, $SiCl_4$, $O_2$, $N_2$, $H_2$, $NF_3$, $SF_6$, He, or Ar, but the inventive concept is not limited thereto.

The shower head 30 may be disposed in an upper portion of the chamber 10 above the seated substrate W and connected to the gas supply 20 in order to provide the process gas(es) 22 into at least a region of the chamber 10 above the seated substrate W.

The electrostatic chuck 40 may be disposed in a lower portion of the chamber 10, and in some embodiments, the substrate W may be seated on the electrostatic chuck 40. With this configuration, the electrostatic chuck 40 hold the substrate W in a fixed position using an applied voltage. In some embodiments, the electrostatic chuck 40 may have a chuck radius RE ranging from about 15 cm to about 16 cm. Thus, the electrostatic chuck 40 may have a diameter ranging from about 30 cm to about 32 cm.

In this regard, the substrate W may have a substrate radius RS similar to the chuck radius RE. For example, the substrate W may have the substrate radius RS (e.g., see FIG. 10) of about 15 cm and a substrate diameter of about 30 cm.

The first RF power supply 50 may be disposed outside the chamber 10 and may be used to power to the electrostatic chuck 40. That is, the first RF power supply 50 may be configured to provide first RF power 58 to the electrostatic chuck 40, thereby inducing (e.g., causing the development of) plasma 42 in relation to the substrate W.

In some embodiments like the one illustrated in FIG. 1, the first RF power supply 50 may include a source power supply 52, a first bias power supply 54 and a second bias power supply 56. The source power supply 52 may be used to generate a source power 51 having a first frequency (e.g., about 60 MHz) that induces the plasma 42 in relation to the substrate W. The first bias power supply 54 may be used to generate a first bias power 53 having a second frequency lower than the first frequency (e.g., ranging from between about 2 MHz to about 10 MHz) in order to better concentrate the plasma 42 in a region more proximate to the substrate W. And the second bias power supply 56 may be used to generate a second bias power 55 having a third frequency greater than the first frequency (e.g., about 400 KHz) in order to accelerate the flow of the plasma 42 towards the substrate W.

A matcher 59 may be provided between the first RF power supply 50 and the electrostatic chuck 40 in order to match impedances between the first RF power 58 and the plasma 42, thereby increasing output efficiency of the first RF power supply 50.

Figure 2:
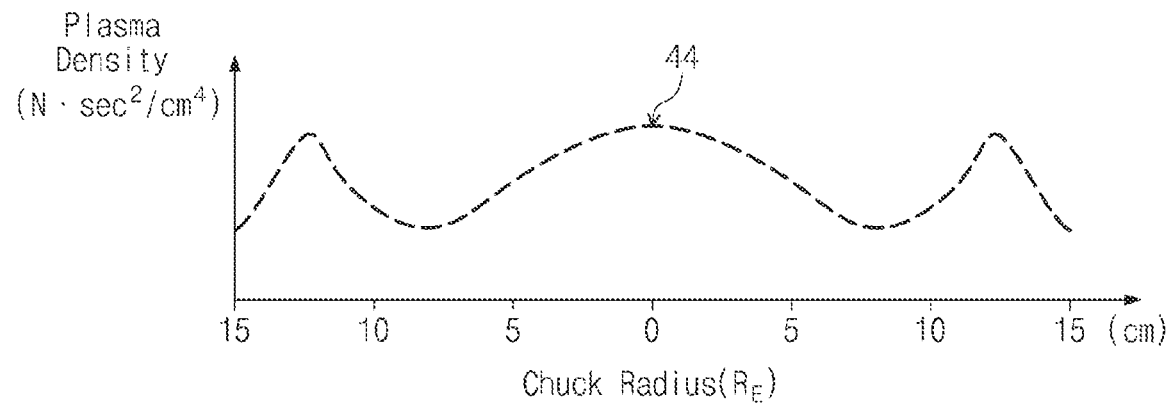
FIG. 2 is a graph illustrating plasma density as a function of position across an electrostatic chuck.

FIG. 2 is a graph conceptually illustrating plasma density as a function of location across the radial extent of the electrostatic chuck 40 (i.e., the chuck radius RE). Thus, a first density curve 44 for the plasma 42 generated by the first RF power 58 of FIG. 1 is shown in FIG. 2.

It is apparent from FIG. 2 that the density of the plasma 42 varies across the radial extend of the chuck radius RE. That is, the first density 44 is non-uniform across the radial extend of the chuck radius RE with relatively higher densities of plasma existing at a center portion and at an edge portion, and with relatively lower densities of plasma at an intermediate portion between the center portion the edge portion. In this regard, the "center portion" of the electrostatic chuck 40 may be defined as an ellipsoidal, centrally disposed region generally surrounding a geometric center point of the electrostatic chuck 40 (e.g., a region having a radius extending from the center point ranging from about 0 cm to about 5 cm). The "edge portion" of the electrostatic chuck 40 may be defined as an outer circumferential (e.g., ring-shaped) region extending proximate to an outer edge of the electrostatic chuck 40 (e.g., a region having a radius extending from the center point of the electrostatic chuck 40 ranging from between about 10 cm to about 15 cm). The "intermediate region" of the electrostatic chuck 40 may be defined as an inner circumferential (e.g., ring-shaped) region extending between the central portion and the edge portion of the electrostatic chuck 40 (e.g., a region having a radius extending from the center point of the electrostatic chuck 40 ranging from between about 5 cm to about 10 cm). However, those skilled in the art will recognize that the foregoing dimensions are drawn to the working example which assumes an electrostatic chuck having a chuck radius RE ranging from about 15 cm to about 16 cm. Larger or smaller chuck used with commensurately larger or smaller substrates will result in different sizes and/or different range boundaries between respective central portions, intermediate portions and edge portions of a particular chuck.

Referring to FIG. 2, the density of the plasma 42 may be understood as being relatively high in the central portion and the edge portion of the electrostatic chuck 40, and relatively low in the intermediate portion of the electrostatic chuck 40.

Referring now to FIG. 1, the magnet 60 may be provided proximate a top surface (e.g., the ceiling) of the chamber 10. In some embodiments, the magnet 60 may be disposed above the shower head 30.

Figure 3:
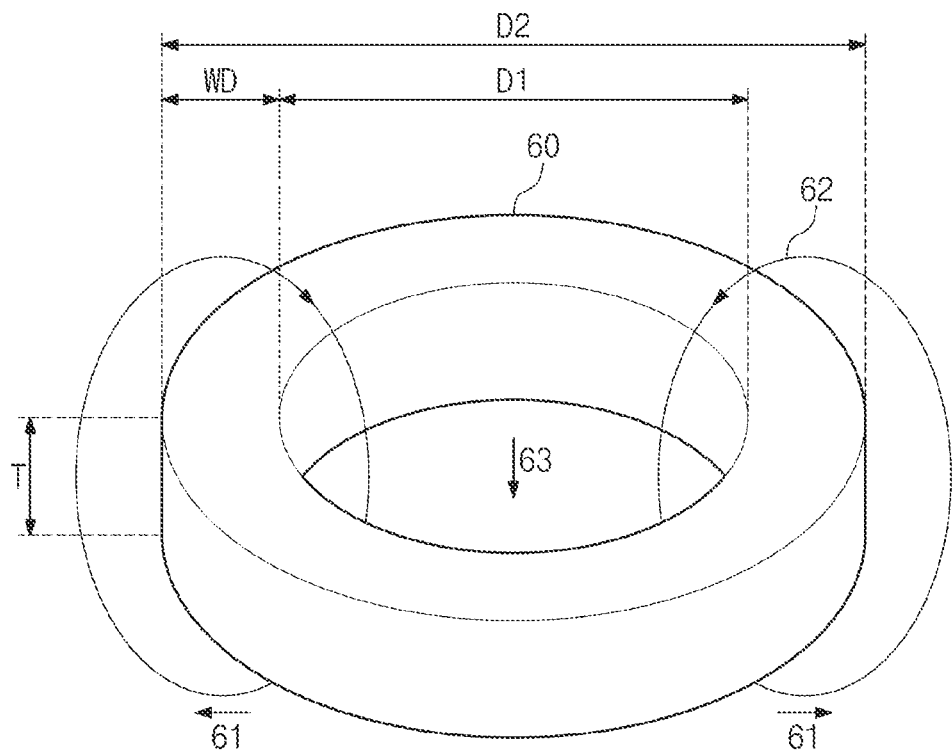
FIG. 3 is a perspective view further illustrating in one example the magnet of FIG. 1.

FIG. 3 is a perspective view illustrating in one example the magnet 60 of FIG. 1.

Referring to FIG. 3, the magnet 60 may be an electro magnet having a ring shape. Alternately, the magnet 60 may be a permanent magnet having a ring shape.

Referring to FIGS. 1 and 3, the magnet 60 may be used to selectively induce a magnetic field 62 in a region at least above the substrate W and the electrostatic chuck 40 by applying a second RF power 76 to the magnet 60. In some embodiments, the ring-shaped magnet 60 may have an inner radius D1 that ranges from about one-half to about onequarter the chuck radius RE of the electrostatic chuck 40 or the substrate radius RS. In one particular embodiment, the inner radius D1 of the magnet 60 may be one-third of the chuck radius RE of the electrostatic chuck 40. Thus, assuming that the chuck radius RE is about 15 cm, the inner radius D1 of the magnet 60 may be about 5 cm.

In some embodiments, the magnet 60 may have a width WD and a thickness T ranging from about one-fifteenth to about one-fifth of the chuck radius RE of the electrostatic chuck 40. For example, each of the width WD and the thickness T of the magnet 60 may be about two-fifteenths of the chuck radius RE of the electrostatic chuck 40. Thus, assuming that the chuck radius RE is about 15 cm, each of the width WD and the thickness T of the magnet 60 may be about 2 cm.

The magnet 60 may have an outer radius D2 that ranges from about two-fifths to about four-fifths of the chuck radius RE of the electrostatic chuck 40. In one particular example, the outer radius D2 of the magnet 60 may be about three-fifths the chuck radius RE. Thus, assuming that the chuck radius RE is about 15 cm, the outer radius D2 of the magnet 60 may be about 9 cm.

Figure 4:
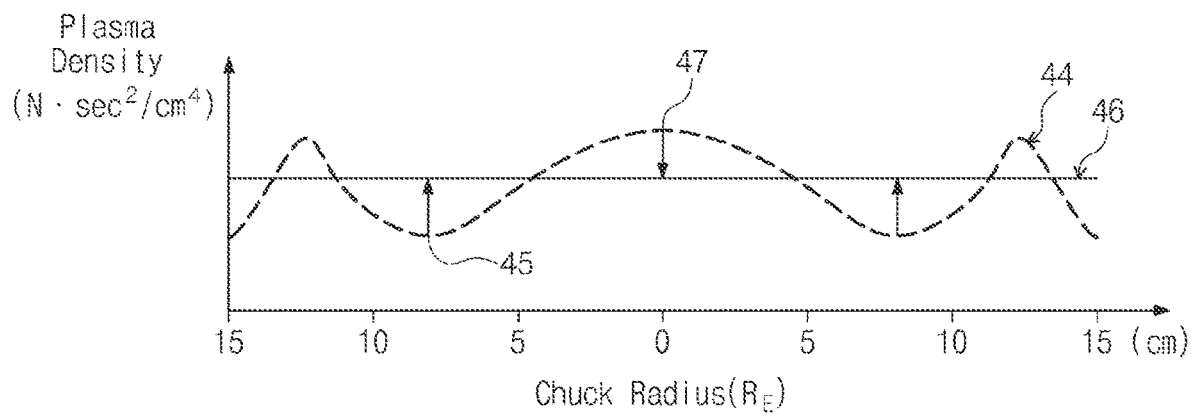
FIG. 4 is another graph illustrating changes in plasma density as a function of position across an electrostatic chuck.

FIG. 4 is another graph conceptually illustrating plasma density as a function of location across the radial extent of the electrostatic chuck 40 (i.e., the chuck radius RE). Here, FIG. 4 illustrates the first density 44 for the plasma 42 of FIG. 1 which varies across the radial extend of the electrostatic chuck 40, and a second density 46 for the plasma 42 of FIG. 1 which is constant across the radial extend of the electrostatic chuck 40.

Referring to FIGS. 1, 3 and 4, it is assumed that the magnet 60 induces the magnetic field 62—the introduction of which may be used to selectively change the density of the plasma 42 from an uncorrected density like the first density 44 to a corrected density like the second density 46. Accordingly, the second density 46 for the plasma 42 may be substantially constant regardless of the particular chuck radius RE for the electrostatic chuck 40. In this regard, a horizontal component 61 of the magnetic field 62 may be selected to substantially match (e.g., overlay) the intermediate portion of the electrostatic chuck 40 in order to raise the valley portion 45 of the first density 44. Further, a centering vertical component 63 of the magnetic field 62 may be selected in relation to the center portion and the edge portion of the electrostatic chuck 40 in order to lower the crest portion 47 of the first density 44. Since the magnetic field 62 may be designed to selectively increase the density of the plasma 42 associated with the center portion and the edge portion of the electrostatic chuck 40, and may be further designed to reduce the density of the plasma 42 associated with the intermediate portion of the electrostatic chuck 40, the uncorrected first density 44 may be changed to yield the corrected second density 46. In this manner, uniformity of plasma density may be improved by the influence of the magnetic field 62, as induced by the magnet 60 disposed at a position above the electrostatic chuck 40 and the substrate W.

Referring again to FIG. 1, a magnetic shield 68 may be provided on top and side surfaces of the magnet 60. The magnetic shield 68 may be used to block and/or greatly diminish the magnetic field 62 in unintended directions. Alternately, the magnetic shield 68 may prevent the magnet 60 from interacting with an external magnetic field, but the inventive concept is not limited thereto. In some embodiments, the magnetic shield 68 may be formed of or include at least one of ferroelectric materials (e.g., iron (Fe) and/or steel use stainless (SUS) materials).

The second RF power supply 70 may be configured to supply the second RF power 76 to the magnet 60.

Figure 5:
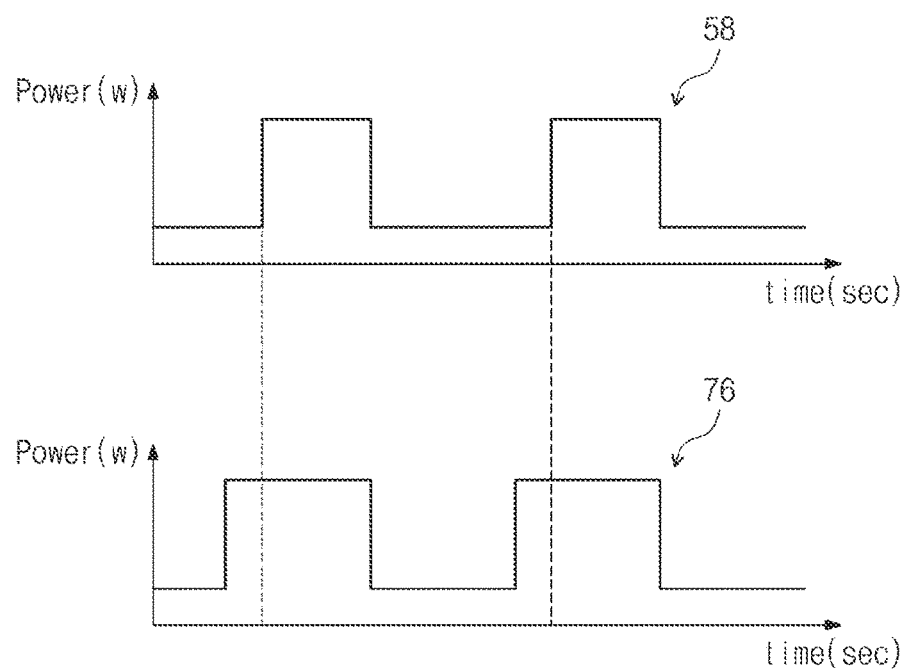
FIG. 5 is a waveform diagram illustrating in one example the first and second radio-frequency powers of FIG. 1.

FIG. 5 is a waveform diagram illustrating in one example the first RF power 58 and the second RF power of FIG. 1.

Referring to FIG. 5, the first RF power 58 and the second RF power 76 may each have a pulse waveform of defined frequency. In some embodiments, the frequency of the first RF power 58 and the second RF power 76 may be the same (e.g., about 60 MHz). Alternately, the frequency of each of the first RF power 58 and the second RF power 76 may range from 2 MHz to 10 MHz, or may be 400 KHz, but the inventive concept is not limited thereto.

Figure 6:
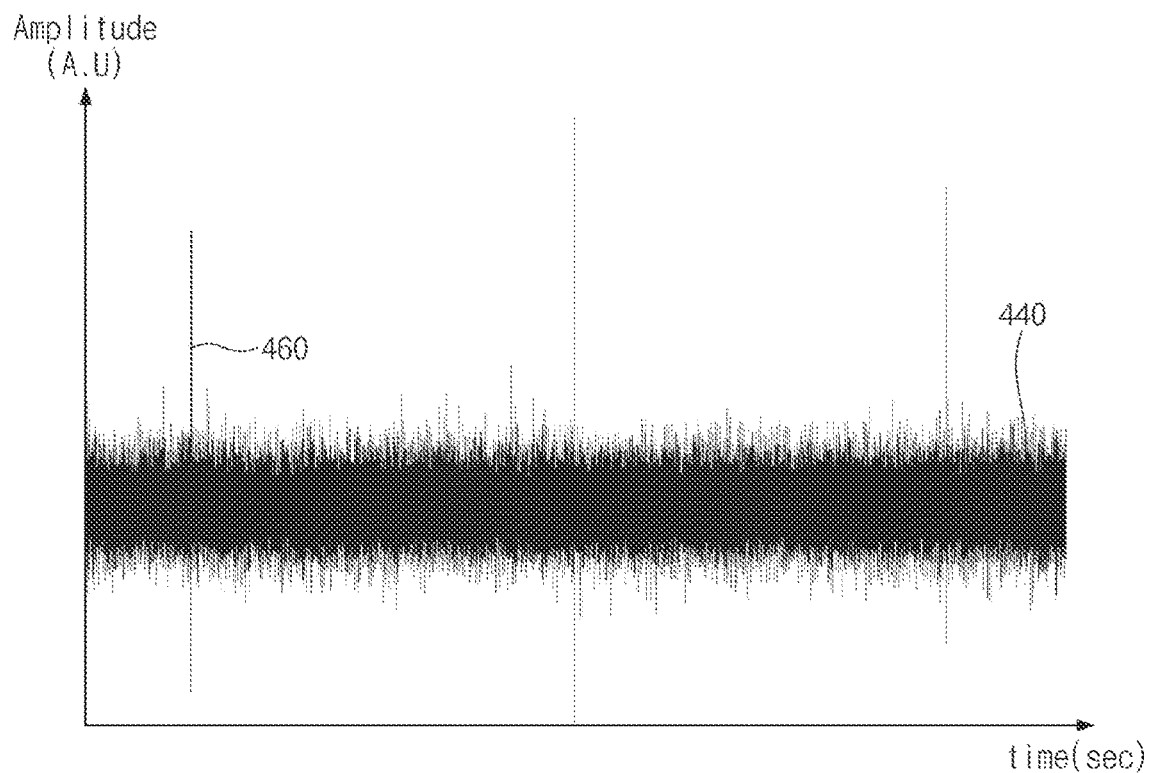
FIG. 6 is a graph illustrating an arcing failure in the spectrum of plasma induced when the first and second radio-frequency powers of FIG. 5 have the same phase.

FIG. 6 is a graph illustrating an arcing failure 460 in a spectrum 440 of the plasma 42 which may be induced when the first RF power 58 and the second RF power 76 of FIG. 5 have the same phase (e.g., are synchronously phased).

Referring to FIGS. 1, 5 and 6, in a case where the phase of the second RF power 76 leads the phase of the first RF power 58, the arcing failure 460 will not occur. Thus, the second RF power supply 70 may include a power source 72 and a modulator 74, wherein the power source 72 may be used to generate a source voltage (e.g., a DC voltage) for the second RF power 76 and the modulator 74 may be provided between the power source 72 and the magnet 60 in order to modulate the source voltage generated by the second RF power 76.

Figure 7:
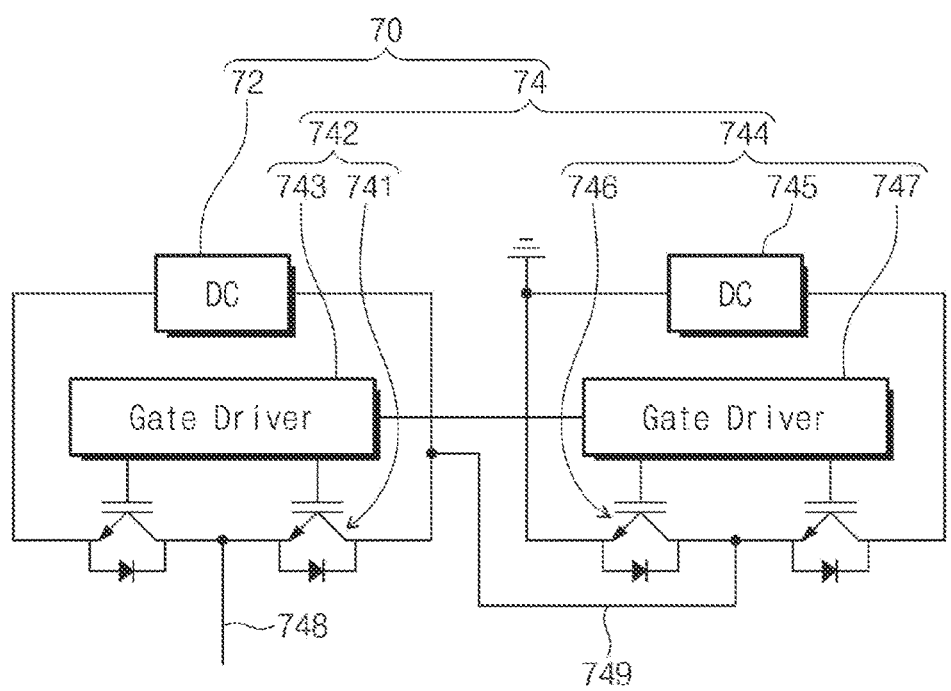
FIG. 7 is a circuit diagram illustrating in one example the modulator of FIG. 1.
Figure 8:
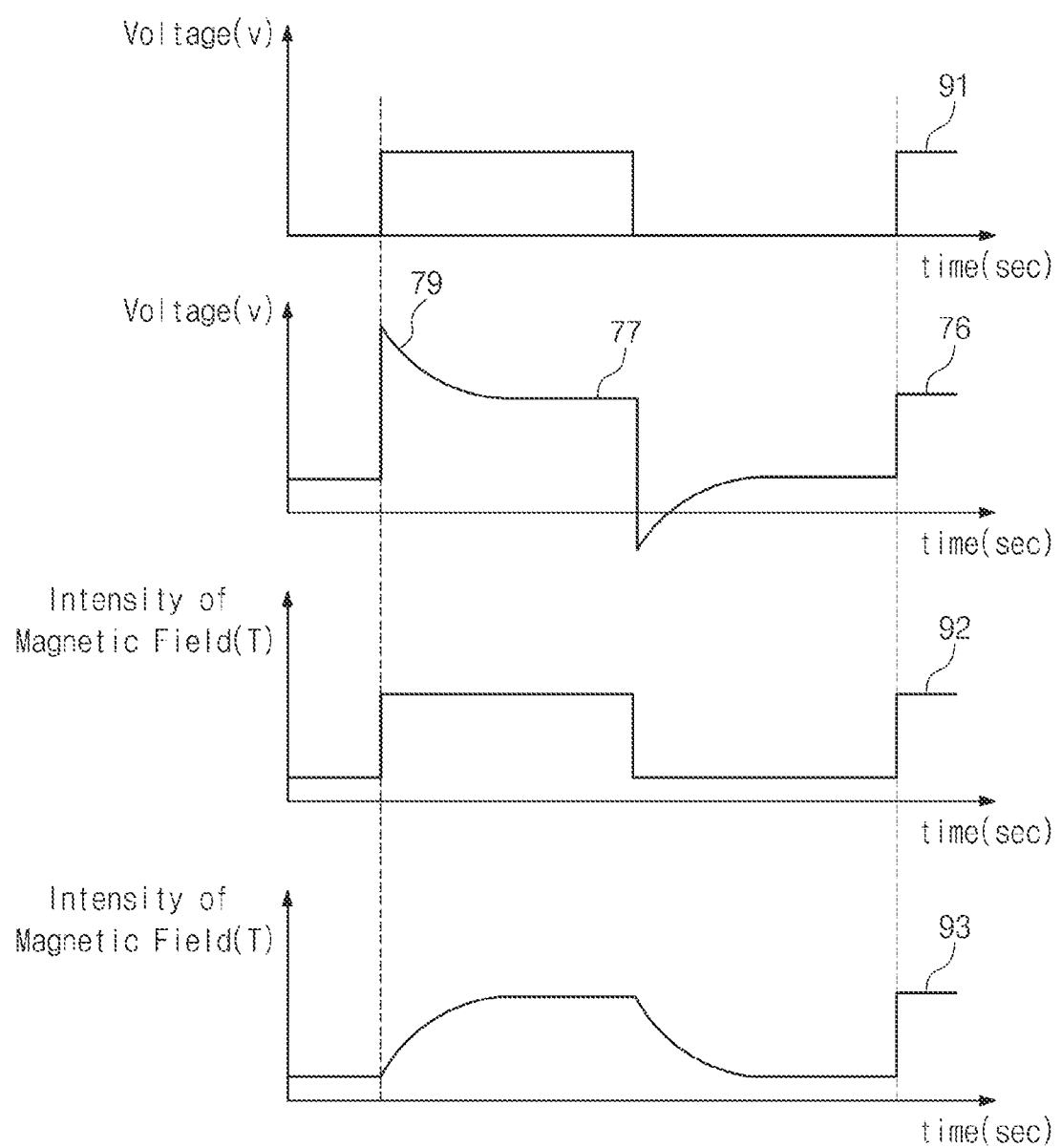
FIG. 8 is a waveform diagram illustrating waveforms of the second radio-frequency power, a trigger signal, and square and sawtooth intensities of magnetic field.

FIG. 7 is a circuit diagram illustrating in one example the modulator 74 of FIG. 1, and FIG. 8 is a waveform diagram illustrating the second RF power 76, a trigger signal 91 for the modulator 74 of FIG. 7, a square wave 92 and a sawtooth wave 93 for intensities of the magnetic field 62.

Referring to FIGS. 7 and 8, the modulator 74 may include a pulse generator 742 and a peak generator 744.

The pulse generator 742 may be series connected with the power source 72. The pulse generator 742 may generate a pulse 77 of the second RF power 76. As an example, the pulse generator 742 may include first delay cells 741 and a first gate driver 743. Each of the first delay cells 741 may include a transistor and a diode. The transistor and the diode may be connected in parallel to the power source 72. The first gate driver 743 may be connected to the gates of the transistors of the first delay cells 741. The first gate driver 743 may provide the trigger signal 91 to the gates of the transistors of the first delay cells 741 to drive the gates of the transistors. The first delay cells 741 may generate the pulse 77 of the second RF power 76 in response to the trigger signal 91. The pulse 77 of the second RF power 76 may be output through a first output terminal 748 between the first delay cells 741.

The peak generator 744 may be provided between and connected to the power source 72 and the first delay cells 741. The peak generator 744 may generate a peak 79 of the pulse 77 of the second RF power 76. As an example, the peak generator 744 may include an additional power source 745 (e.g., a DC power), second delay cells 746, and a second gate driver 747. One end of the additional power source 745 may be grounded. The second delay cells 746 may be connected in series to the additional power source 745. A second output terminal 749 between the second delay cells 746 may be connected to a node between the power source 72 and the first delay cells 741. Each of the second delay cells 746 may include a transistor and a diode. The second gate driver 747 may be connected to the gates of the transistors of the second delay cells 746. The second gate driver 747 may provide the trigger signal 91 to the gates of the transistors of the second delay cells 746 to drive the gates of the transistors. The second delay cells 746 may generate the peak 79 of the second RF power 76 in response to the trigger signal 91. The peak 79 of the second RF power 76 may be provided to the pulse generator 742 through the second output terminal 749. The pulse and peak 77 and 79 of the second RF power 76 may be provided to the magnet 60 through the first output terminal 748.

The pulse and peak 77 and 79 of the second RF power 76 may be used to induce the intensity of the magnetic field 62 in the form of the square wave 92. Due to the square wave 92, the intensity of the magnetic field 62 may be synchronized with the intensity of the first RF power 58, and in this case, the plasma 42 may be stably induced.

In the case where the peak 79 is absent, the pulse 77 of the second RF power 76 may induce the intensity of the magnetic field 62 in the form of the sawtooth wave 93. In the case of the sawtooth wave 93, the intensity of the magnetic field 62 will not be synchronized with the first RF power 58 and the arcing failure 460 will not occur in relation to the plasma 42.

Thus, where the pulse and peak 77 and 79 are used to generate the magnetic field 62 in the form of the square wave 92, it is possible to prevent (or greatly suppress) an arcing failure 450 with respect to the plasma 42.

Hereinafter, a method of fabricating a semiconductor device using the apparatus 100 of FIG. 1 will be described in some additional detail.

Figure 9:
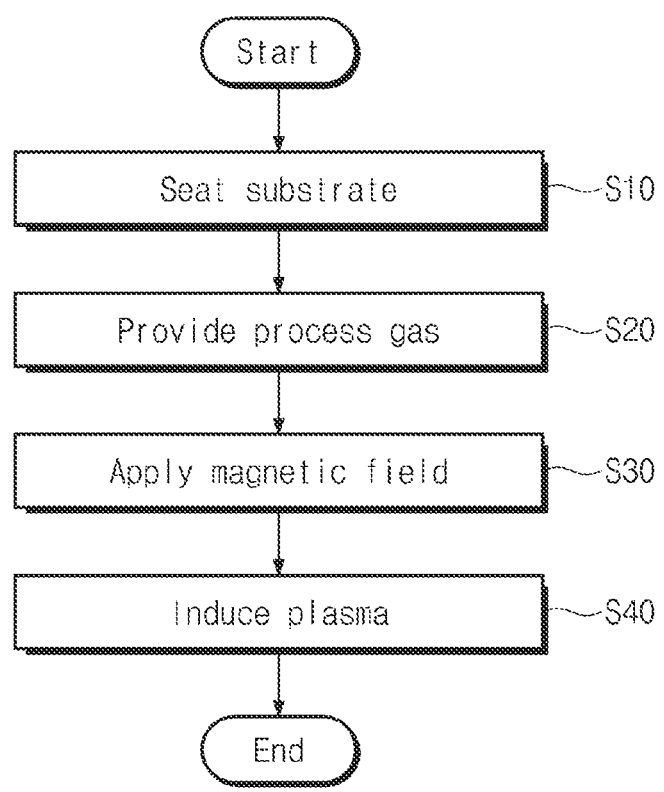
FIG. 9 is a flow chart illustrating in one example a method of fabricating a semiconductor device according to embodiments of the inventive concept.

FIG. 9 illustrates a method of fabricating a semiconductor device, according to an embodiment of the inventive concept.

Referring to FIGS. 1 and 9, the substrate W may be seated on the electrostatic chuck 40 (S10). Here, the substrate W may be formed of or include crystalline silicon. Alternately, the substrate W may include a semiconductor wafer, but the inventive concept is not limited thereto. In some embodiments, the substrate W may have the substrate radius RS of about 15 cm.

Figure 10:
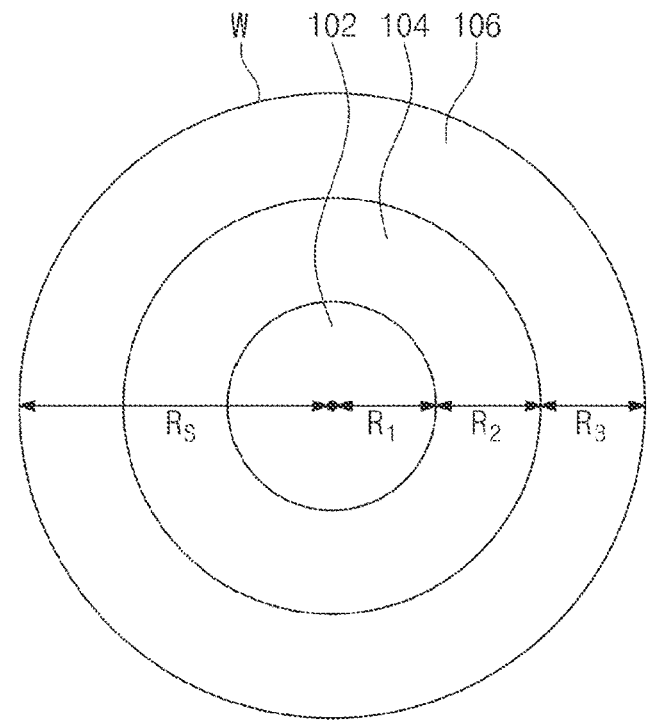
FIG. 10 is a plan view further illustrating in one example the substrate of FIG. 1.

FIG. 10 is a plan (or top-down) view further illustrating in one the substrate W of FIG. 1.

Referring to FIG. 10, the substrate W may be conceptually divided into three (3) radially-adjacent portions; a center portion 102, an intermediate portion 104, and an edge portion 106, wherein the intermediate portion 104 is disposed between the center portion 102 and the edge portion 106. Each of the center portion 102, the intermediate portion 104, and the edge portion 106 may be characterized by a same "radial width". That is, assuming that the substrate radius RS is about 15 cm, the center portion 102 may have a first radius width R1 of about 5 cm, the intermediate portion 104 may have a second radial width R2 of about 5 cm, and the edge portion 106 may have a third radial width R3 of about 5 cm. However, in other embodiments, one or more of the first radial width R1, the second radial width R2 and the third radial width R3 may be different depending on the respective definitions of the central portion 102, the intermediate portion 104 and the third portion 106. Further, in some embodiments, at least one or more of the central portion 102, the intermediate portion 104 and the third portion 106 may not be radial adjacent other portions.

Referring again to FIGS. 1 and 9, the gas supply 20 may provide (e.g., inject) one or more process gas(es) 22 to at least a region above the seated substrate W (S20). Here, depending on the nature of the plasma process being performed, the process gas(es) 22 may be used to deposit a material layer, alter a material layer or etch a material layer formed on the substrate W.

Once the plasma is formed, the second RF power supply 70 may apply the second RF power 76 to the magnet 60 to induce the magnetic field 62 above the substrate W (S30), and the first RF power supply 50 may apply the first RF power 58 to the electrostatic chuck 40 to induce the plasma 42 in a region above the substrate W (S40).

Figure 11:
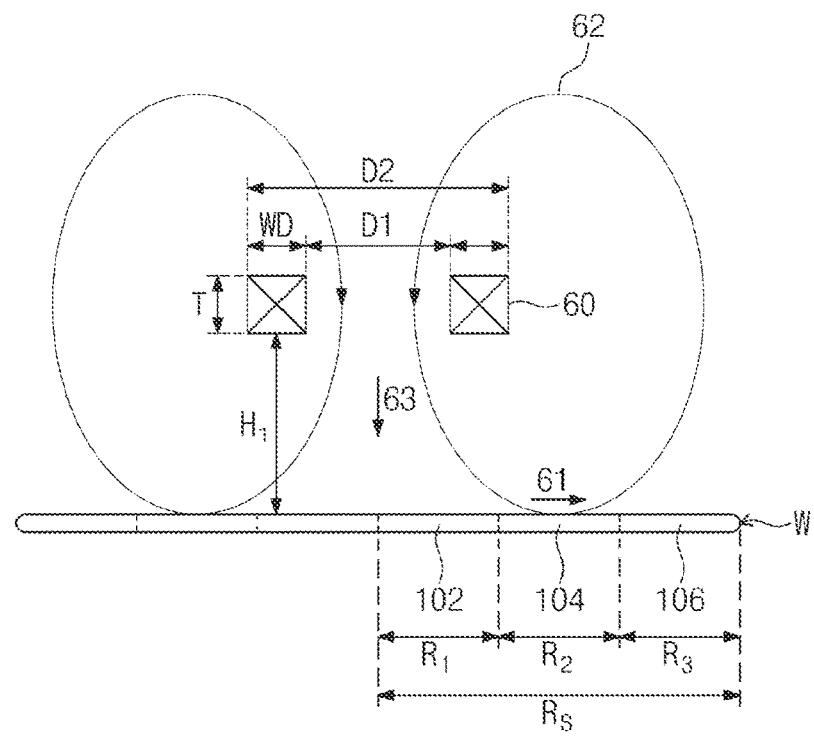
FIG. 11 is a side view further illustrating relationships between the substrate and the magnet of FIG. 1.

FIG. 11 is a partial side view further illustrating in one example a relationship between the substrate W and the magnet 60 of FIG. 1.

Referring to FIGS. 1 and 11, the magnet 60 may be positioned to substantially align the horizontal component 61 of the magnetic field 62 above at least part of the intermediate portion 104 of the substrate W in order to position the generated magnetic field 62. as desired, in relation to the substrate W and its constituent portions.

In some embodiments, the magnetic field 62 may be produced as concentric circles or ellipses around the magnet 60 as shown in FIG. 11, such that at least a portion of the magnetic field 62 passes through the top surface of the substrate W. The horizontal component 61 may be a component producing the magnetic field 62 which extends in parallel with the top surface of the substrate W, and the vertical component 63 may be a component producing the magnetic field 62 which extends perpendicular to the top surface of the substrate W.

In some embodiments, the magnet 60 be a ring magnet having an inner radius D1 ranging from one-half to one-fourth the substrate radius RS. For example, the inner radius D1 of the magnet 60 may be about one-third the substrate radius RS. Thus, when the substrate radius RS is about 15 cm, the magnet 60 may have the inner radius D1 of about 5 cm.

The magnet 60 may be disposed at a vertical height H1 above the substrate W. In some embodiments, the vertical height H1 may be 4 times the inner radius D1. Alternately, the vertical height H1 of the magnet 60 may be about four-thirds the substrate radius RS. Thus, when the inner radius D1 of the magnet 60 is about 5 cm and the substrate radius RS is about 15 cm, the vertical height H1 of the magnet 60 may be about 20 cm.

As noted above, in some embodiments, the magnet 60 may to have a width WD and a thickness T that range from about one-fifteenth to about one-fifth (or three-fifteenth) of the substrate radius RS. For example, each of the width WD and the thickness T of the magnet 60 may be about two-fifteenth of the substrate radius RS. Thus, when the substrate radius RS is about 15 cm, each of the width WD and the thickness T of the magnet 60 may be about 2 cm.

The magnet 60 may have an outer radius D2 that ranges from about two-fifths to about four-fifths of the substrate radius RS. For example, the outer radius D2 of the magnet 60 may be about three-fifths of the substrate radius RS. Thus, when the substrate radius RS is about 15 cm, the outer radius D2 of the magnet 60 may be about 9 cm.

Alternately, the inner radius D1 of the magnet 60 may be equal to the second radius R2 of the intermediate portion 104. Alternately or additionally, the inner radius D1 of the magnet 60 may be equal to at least one of the first radius R1 of the center portion 102, the second radius R2 of the intermediate portion 104, and the third radius R3 of the edge portion 106.

Figure 12:
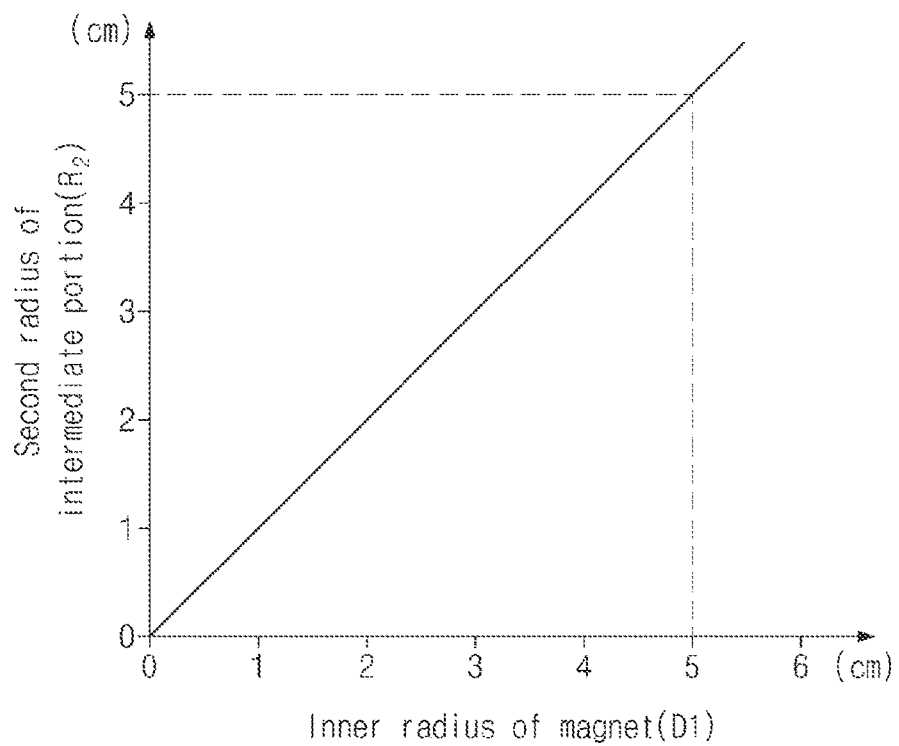
FIG. 12 is a graph illustrating a relationship between the second radius of the intermediate portion of the substrate and the inner radius of the magnet of FIG. 11.

FIG. 12 is a graph illustrating a relationship between the second radius R2 of the intermediate portion 104 of the substrate W and the inner radius D1 of the magnet 60 of FIG. 11.

Referring to FIGS. 11 and 12, the inner radius D1 of the magnet 60 may be equal to the second radius R2 and/or the radial width of the intermediate portion 104 of the substrate W. For example, each of the inner radius D1 and the second radius R2 may be about 5 cm. When each of the inner radius D1 and the second radius R2 is about 5 cm, the substrate W may have the substrate radius RS of about 15 cm. The substrate W may have a diameter of about 30 cm and/or about 12 inches. In some embodiments, the inner radius D1 and the second radius R2 may be about 4 cm. When each of the inner radius D1 and the second radius R2 is about 4 cm, the substrate W may have the substrate radius RS of about 12 cm. The substrate W may have a diameter of about 24 cm and/or about 10 inches.

Figure 13:
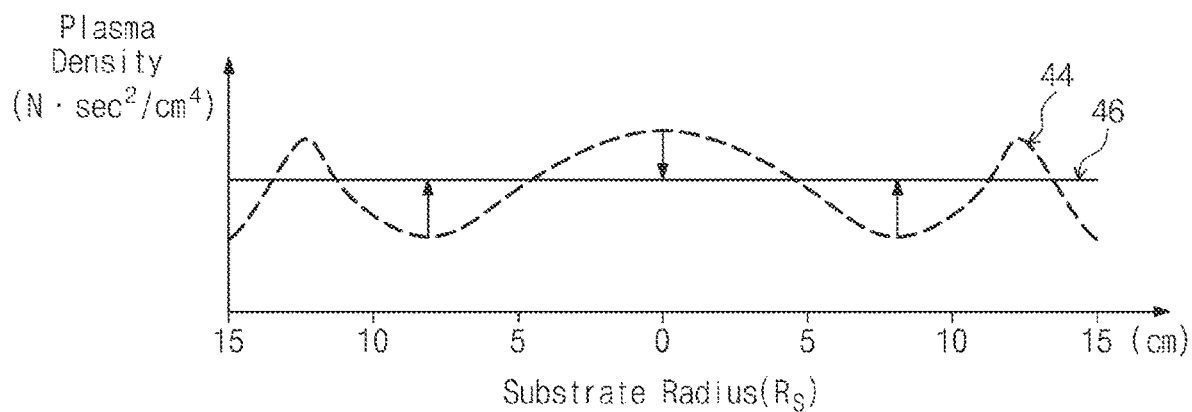
FIG. 13 is another graph illustrating changes in plasma density as a function of position across an electrostatic chuck.

FIG. 13 is another graph conceptually illustrating density of the plasma 42 of FIG. 1 as a function of location across the radial extent of the electrostatic chuck 40 (i.e., the chuck radius RE).

Referring to FIG. 13, in the absence of the magnetic field 62, the plasma 42 will exhibit the first density 44 which is non-uniform across radial extent of the electrostatic chuck 40. As a result of this non-uniform plasma density, etch uniformity across the substrate W will be similarly non-uniform, thereby degrading the performance of circuitry fabricated in the substrate W. However, when the magnetic field 62 is provided as described above, the plasma 42 will exhibit the second density 46 which is substantially flat and highly uniform across the radial extent of the electrostatic chuck 40. Accordingly, etch uniformity across the substrate W will be much improved.

As described above, in apparatuses and method fabricating semiconductor devices according to embodiments of the inventive concept, a magnet may be disposed above an electrostatic chuck seating a substrate W, wherein the magnet has an inner radius that ranges from about one-half to one-fourth the radius of the electrostatic chuck or the radius of the substrate W. This configuration, with application of a magnetic field generated by the magnet, improves uniformity of plasma density.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
    seating a substrate having a substrate radius on an electrostatic chuck;
    applying first radio-frequency power to the electrostatic chuck to induce plasma in a region at least above the electrostatic chuck, wherein the first radio-frequency power is provided by a first radio-frequency power supply; and
    generating a magnetic field in the region at least above the electrostatic chuck using a magnet having a ring-shape and disposed above the electrostatic chuck by applying second radio-frequency power to the magnet, wherein the second radio-frequency power is applied to the magnet by a second radio-frequency power supply including a power source generating a source voltage, and a modulator connected between the power source and the magnet, and wherein the modulator is configured to generate a pulse through modulation of the source voltage,
    wherein the magnet has an inner radius ranging from about one-half to about one-fourth of the substrate radius,
    wherein the modulator comprises:
    a pulse generator configured to generate the pulse; and
    a peak generator connected to the pulse generator and configured to generate a peak of the pulse,
    wherein the pulse generator comprises:
    first delay cells connected in series to the power source; and
    a first gate driver connected to the first delay cells to provide a trigger signal to the first delay cells, and
    wherein the peak generator comprises:
    an additional power source;
    second delay cells connected in series to the additional power source, and
    a second gate driver connected to the first gate driver and the second delay of cells to provide the trigger signal to the second delay of cells.

2. The method of claim 1, wherein the inner radius of the magnet is about one-third of the substrate radius.

3. The method of claim 2, wherein the substrate radius is about 15 cm, and the inner radius of the magnet is about 5 cm.

4. The method of claim 2, wherein the substrate includes a center portion having a first radial width, an intermediate portion having a second radial width and an edge portion having a third radial width,
    each of the first radial width, the second radial width and the third radial width is the same, and
    a sum of the first radial width, the second radial width and the third radial width is equal to the substrate radius.

5. The method of claim 4, wherein the inner radius of the magnet is equal to each of the first radial width, the second radial width and the third radial width.

6. The method of claim 1, wherein the magnet has a width and a thickness, each ranging from about one-fifteenth to about one-fifth of the substrate radius.

7. The method of claim 1, wherein the magnet has an outer radius ranging from about two-fifths to about four-fifths of the substrate radius.

8. The method of claim 1, wherein the magnet is disposed at a vertical height above the substrate about four-thirds of the substrate radius.

9. The method of claim 1, wherein a phase of the second radio-frequency power leads a phase of the first radio-frequency power.

10. The method of claim 1, wherein the second radio-frequency power induces intensity of the magnetic field in a square wave form.

11. A method of fabricating a semiconductor device, the method comprising:
    seating a substrate having a substrate radius on an electrostatic chuck having a chuck radius;
    applying a first radio-frequency power to the electrostatic chuck to induce plasma in a region at least above the electrostatic chuck, wherein the first radio-frequency power is provided by a first radio-frequency power supply; and
    generating a magnetic field in the region at least above the electrostatic chuck using a magnet disposed above the electrostatic chuck by applying second radio-frequency power to the magnet, wherein the second radio-frequency power is applied to the magnet by a second radio-frequency power supply including a power source generating a source voltage, and a modulator connected between the power source and the magnet, and wherein the modulator is configured to generate a pulse through modulation of the source voltage,
    wherein the substrate includes a center portion having a first radial width, an intermediate portion having a second radial width, and an edge portion having a third radial width, the intermediate portion is disposed between the center portion and the edge portion, and the magnet has an inner radius equal to the second radial width, wherein the modulator comprises:

a pulse generator configured to generate the pulse, and a peak generator connected to the pulse generator and configured to generate a peak of the pulse, wherein the pulse generator comprises:

first delay cells connected in series to the power source; and a first gate driver connected to the first delay cells to provide a trigger signal to the first delay cells, and wherein the peak generator comprises:

an additional power source;

second delay cells connected in series to the additional power source; and a second gate driver connected to the first gate driver and the second delay cells to provide the trigger signal to the second delay cells.

12. The method of claim 11, wherein the inner radius of the magnet is about 5 cm and the substrate radius is about 15 cm, or the inner radius of the magnet is about 3 cm and the substrate radius is about 12 cm.

13. The method of claim 11, wherein the magnet is a ring-shaped electromagnet, and the generating of the magnetic field in the region at least above the electrostatic chuck includes applying a second radio-frequency power to the magnet.

14. The method of claim 13, wherein a phase of the second radio-frequency power leads a phase of the first radio-frequency power.

15. The method of claim 13, wherein the second radio-frequency power induces intensity of the magnetic field in a square wave form.

16. An apparatus fabricating a semiconductor device, the apparatus comprising:

a chamber;

an electrostatic chuck having a chuck radius and disposed in a lower portion of the chamber, wherein the electrostatic chuck is configured to seat a substrate;

a shower head disposed in an upper portion of the chamber above the electrostatic chuck and configured to provide gas into a region at least above the electrostatic chuck; and a magnet disposed on the shower head and configured to induce a magnetic field in the region at least above the electrostatic chuck;

a first radio-frequency power supply configured to apply first power to the electrostatic chuck to induce plasma in the region at least above the electrostatic chuck, and a second radio-frequency power supply configured to apply second power to the magnet to generate a magnetic field in the region at least above the electrostatic chuck, the second radio-frequency power supply including a power source generating a source voltage, and a modulator connected between the power source and the magnet, wherein the modulator is configured to generate a pulse through modulation of the source voltage, wherein the magnet has a ring shape including an inner radius ranging from between about one-half to one-fourth of the chuck radius, wherein the modulator comprises:

a pulse generator configured to generate the pulse; and a peak generator connected to the pulse generator and configured to generate a peak of the pulse, wherein the pulse generator comprises:

first delay cells connected in series to the power source; and a first gate driver connected to the first delay cells to provide a trigger signal to the first delay cells, and wherein the peak generator comprises:

an additional power source;

second delay cells connected in series to the additional power source; and a second gate driver connected to the first gate driver and the second delay of cells to provide the trigger signal to the second delay of cells.

* * * * *